AUTOMATIC TUNING SYSTEM RESPONSIVE TO PASS BAND SKIRTS

Filed April 1, 1968 2 Sheets-Sheet 1

INVENTOR.
ARTHUR W. FRENCH
BY M. Lukacher ATTY

AUTOMATIC TUNING SYSTEM RESPONSIVE TO PASS BAND SKIRTS

Filed April 1, 1968

INVENTOR.
ARTHUR W. FRENCH

BY [signature] ATTY

United States Patent Office 3,550,009
Patented Dec. 22, 1970

3,550,009

AUTOMATIC TUNING SYSTEM RESPONSIVE TO PASSBAND SKIRTS

Arthur W. French, Webster, N.Y., assignor to General Dynamics Corporation, a corporation of Delaware Filed Apr. 1, 1968, Ser. No. 717,745
Int. Cl. H04b *1/32*
U.S. Cl. 325—363 11 Claims

ABSTRACT OF THE DISCLOSURE

A system for tuning a preselector filter which is connected between an antenna and a receiver is described. A motor controlled by the output of the receiver varies the tuning (viz.) the passband frequency range) of the preselector filter. Noise is applied to the preselector during the tuning of the filter. A voltage corresponding to the tuning displacement of the preselector filter between predetermined levels of noise power, as detected by the receiver, are stored in a capacitor/potentiometer memory, so as to mark the passage of the leading and trailing skirts of the filter response through the frequency channel to which the receiver is tuned, the potentiometer being coupled to the motor. The motor is reversed when the trailing skirt of the passband passes through the predetermined level, until a point is reached equal to one-half of the potentiometer travel that produced the memory voltage; thus, tuning the preselector filter such that its passband is centered with respect to the center frequency of the channel to which the receiver is tuned.

The present invention relates to an automatic tuning system and particularly to a system for tuning a circuit having a frequency passband, such that the passband is centered with respect to a selected frequency.

The invention is especially suitable for use in a control system for tuning a preselector filter which is located between the antenna and the input to a receiver, such that the passband of the filter is centered at the frequency to which the receiver is tuned. The invention is, however, generally useful for tracking the tuning of any variable tuned circuit having a frequency passband with respect to tuning of another circuit or system and may, for example, be applied to tune antenna coupling circuits which couple the output of a transmitter to a transmitting antenna.

Systems have been developed for tuning circuits to predetermined frequencies automatically, as for example, by using a frequency discriminator to control a mechanism for tuning a circuit until a null output is obtained from the discriminator. Such systems have the disadvantage of being capable of tuning only to a particular frequency to which the discriminator is responsive. Moreover, the servo mechanism which performs the tuning is subject to hunting, overshoot, undershoot and may even have dead spots in its tuning characteristic. It is also necessary to apply a pilot tone to the circuit under test in order that the servo mechanism is able to generate an error voltage. In certain applications, the generation of such an error voltage is disadvantageous. For example, the tuning is a function of the accuracy of the pilot tone frequency and the generation of a pilot tone frequency may be in violation of security requirements which preclude emissions regarding the frequency to which a receiver is tuned.

Accordingly, it is an object of the present invention to provide an improved system for automatically tuning electronic circuits.

It is a further object of the present invention to provide an improved system for tuning a preselector filter to a frequency centered with respect to the frequency channel of a receiver, such that the passband of a filter is centered with respect to the receiver passband.

It is a still further object of the present invention to provide an improved system for automatic tuning of electronic circuits which do not require the transmission through the circuits of a pilot tone.

It is a still further object of the present invention to provide an improved system for tuning electronic circuits which are not limited with respect to the frequency or frequency band to which the circuits may be tuned by virtue of the tuning system.

It is a still further object of the present invention to provide an improved control system for tuning of electronic circuits automatically which is rapid in operation and is free from hunting, overshoot, undershoot and dead spot characteristics.

It is a still further object of the present invention to provide an improved system for checking the performance of a radio receiver.

Briefly described, a control system for tuning an electronic circuit, which system embodies the invention, includes a source of electrical noise signals which may be selectably applied to a means for demodulating signals lying in a preselected frequency channel over a range of frequencies, via the electronic circuit to be tuned. Specifically, the demodulating means may be a radio. Means are provided for mechanically varying the tuning of the circuit, such for example, as an electromechanical actuator, say a motor. A sensing circuit coupled to the output of the receiver produces output signals at the instants when the predetermined levels are obtained from the demodulating means are (a) first obtained, and (b) no longer produced by the demodulating means. These signals thereby mark the positions of the mechanical means which tunes the electronic circuit as the passband of the circuit scans the frequency channel over which the demodulating means is responsive. An electrical memory, say in the form of a potentiometer and a capacitor, is programmed by the marking signals so as to store information in the form of a voltage representing the positional relationship of the mechanical means as the channel response of the demodulating means is scanned. A control for the mechanical means is operated by the memory to reverse its direction upon occurrence of the latter marking signal and to locate the electronic circuit in the center of the positions stored in the memory, thereby tuning the circuit to the center frequency of the channel.

The invention itself, both as to its organization and method of operation, as well as additional objects and advantages thereof will become more readily apparent from a reading of the following description in connection with the accompanying drawings in which.

Figure 1:
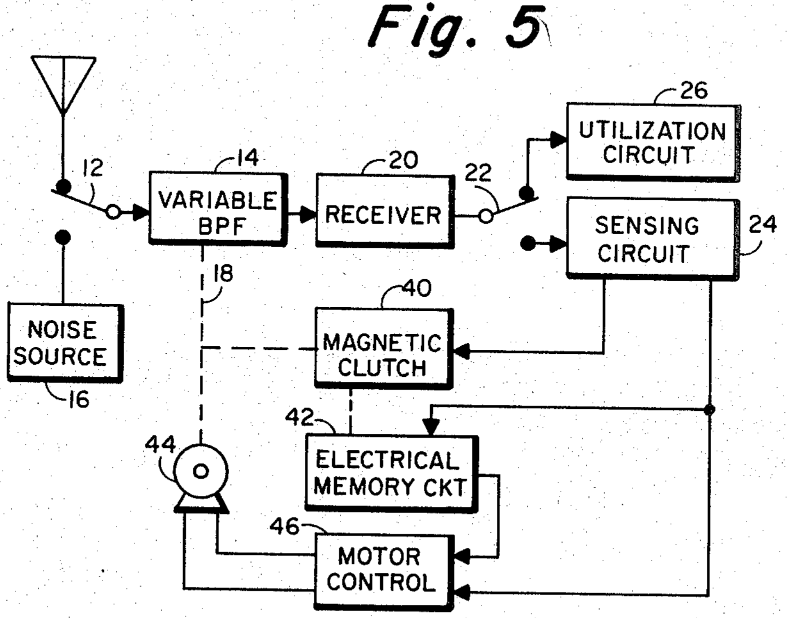
FIG. 1 is a block diagram of a system for automatically tuning a preselector filter, which system embodies the invention.

Referring more particularly to FIG. 1, an antenna 10 may be connected through a switch 12 to a variable passband filter 14. Alternatively, a noise source 16 may be connected to the filter via the switch 12. The source, which may be a diode which generates white noise over the high frequency (2 mHz. to 30 mHz.) spectrum may be suitable.

The filter 14 may be a constant K filter having inductive and capacitive elements which are adapted to be adjusted mechanically by means of a common shaft 18. The gearing between the shaft and the filter elements is desirably arranged, such that the relationship between the angular movement of the shaft 18 and the displacement of the filter passband through the receiver passband is constant. Also, it is desirable that the filter achieve this displacement with a rotation of less than 360° of the shaft 18. In this illustrative example, the bandpass of the filter at 15 mHz. may extend to ±2 mHz. (viz 13 mHz. to 17 mHz.). It is therefore desirable that this frequency range, plus the passband of the demodulating device, be scanned by a rotation of the shaft somewhat less than 360°.

The output of the filter is applied to a receiver 20 which provides the demodulating device. The receiver 20 may, for example, be a high frequency receiver which may be tuned by means of its own tuning controls to any frequency from 2 mHz. to 30 mHz. The frequency channel or passband of the receiver may extend over a predetermined frequency range, say 300 Hz. to 3 kHz. centered about a center frequency which is the frequency to which the receiver is tuned. The receiver may be a single sideband receiver or it may be designed to receive amplitude modulated (AM) signals. It is assumed, for purposes of illustrating the invention, that the receiver is an AM receiver having a frequency channel wide enough to receive audio frequency signals (about ±3 kHz). The output of the receiver is applied to a sensing circuit 24 or to a utilization circuit 26 via a switch 22. The utilization circuit may be the loud speaker or head phones which derive the information transmitted from a transmitting point. The sensing circuit 24 is associated with the tuning control system and senses the noise from the source 16 when the filter 14 is tuned. The filter 14 may be located with the antenna at a position remote from the receiver. The receiver and the filter may be remote from a control point as well as from each other. Thus, the receiver may be initially tuned and then, by application of a preselector tuning control, the switches 12 and 22 actuated so as to connect to the noise source 16 and the sensing circuit 24. This may be accomplished by a control signal transmitted from the remote control point.

The sensing circuit 24 will be described in detail in connection with FIG. 3. Briefly, it includes circuits for deriving control signals as the passband of the filter 14 transverses the frequency channel of the receiver 20. The channel of the receiver 20 is shown by way of example by the curve 30 in FIG. 2. The center frequency of the channel (viz the frequency to which the receiver is tuned) is indicated as $F_{RT}$ in FIG. 2. The passband of the filter is shown in two positions by the curves 32 and 34. In this illustrative example, the approach of the filters response is from a frequency lower than the center frequency of the channel ($F_{RT}$). Therefore, the upper frequency skirt of the filter passband 32 ascends the lower frequency skirt of the channel response 30, and the lower frequency skirt of the filter passband 34 descends the upper frequency skirt of the channel 30. The sensing circuit 24 output signals are produced at positions $T_1$ and $T_2$ as the filter passband transverses the channel, and are obtained when a predetermined level, indicated in FIG. 2 as $L_1$, is first obtained, at $T_1$, from the receiver 20 output and is next obtained, at $T_2$, when that level no longer appears at the receiver output.

The first sensing circuit output, obtained at $T_1$ is used to actuate an electromagnetic clutch 40 which couples the shaft 18 to a variable element of an electrical memory circuit 42. The shaft 18 is rotated by a direct current motor 44, the rotation of which is controlled by a motor control circuit 46. The memory circuit 42 is shown in detail in FIG. 5. Briefly, it includes a potentiometer which is indexed to one end of its travel when the clutch 40 is disengaged. When the clutch is engaged, the potentiometer displacement is linearly related to the angular position of the shaft 18 and therefore to the tuning of the filter 14. When the second signal, at $T_2$, is sensed by the circuit 24, the motor control 46 is actuated, so as to reverse the motor. The memory circuit includes a capacitor which is charged to a voltage corresponding to the displacement (rotation) of the potentiometer between $T_1$ and $T_2$. This circuit also includes a resistor which permits half the voltage characteristic relative to potentiometer current, as was the case prior to reversal of the motor. Thus, the potentiometer runs half the distance in the reverse direction as it did in the forward direction in order to develop a like voltage level. The voltage characteristic produced by the potentiometer is compared with the voltage stored across the capacitor. When these voltages are equal, an output is produced from the memory which stops the motor, thereby positioning the filter 14 halfway between its positions at $T_1$ and $T_2$. The passband of the filter will then be centered with respect to the channel of the receiver.

The system may also be used in order to check the performance of the receiver, inasmuch as the control voltages will not be sensed by the circuit 24, so as to start and stop the motor, if the receiver is not operating properly. Thus, if the motor transverses the passband without stopping and strikes a limit switch, a circuit actuated by the switch may be used to operate an indicator signalling the improper performance of the receiver.

Figure 5:
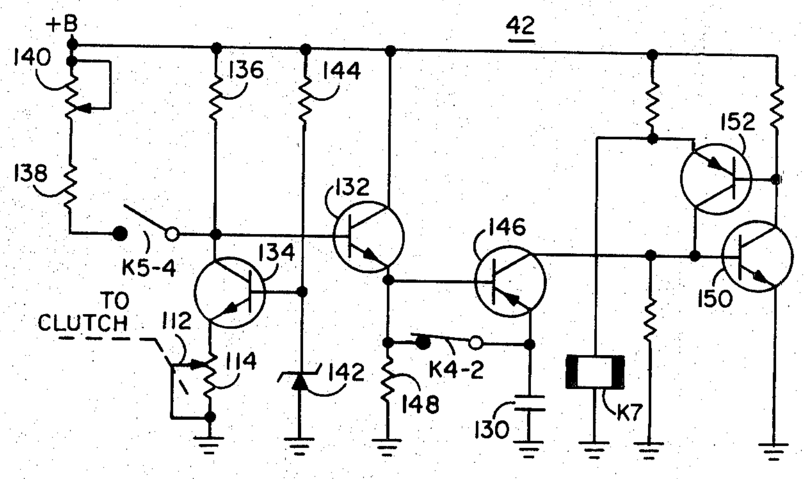
FIG. 5 is a schematic diagram of the electrical memory circuit of the system shown in FIG. 1.
Figure 3:
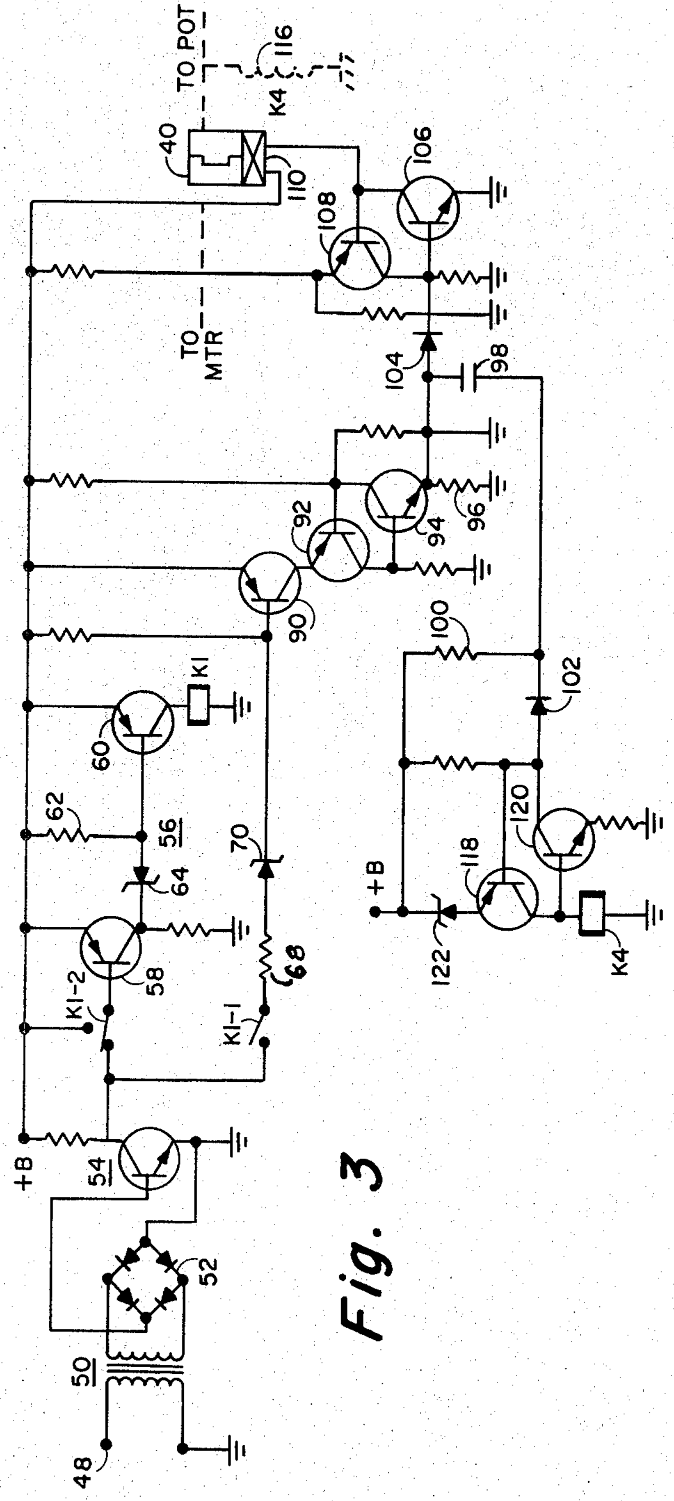
FIG. 3 is a circuit diagram of the sensing circuit and magnetic clutch mechanism of the system shown in FIG. 1.
Figure 4:
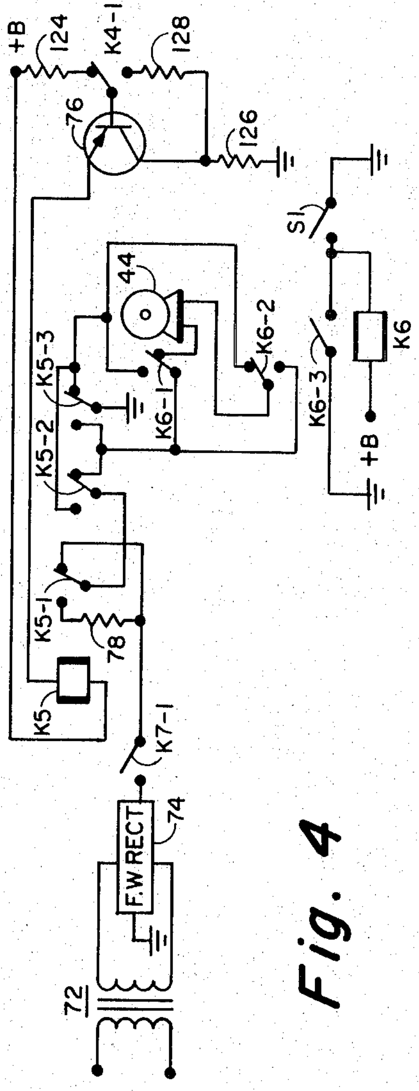
FIG. 4 is a schematic diagram of the motor control circuits of the system shown in FIG. 1.

The sensing circuit 24 and the clutch 40 are shown in greater detail in FIG. 3. As mentioned above, a tuning command from a control point or by actuating a push button on the receiver 20 is operative to actuate the switches 12 and 22 (FIG. 1) and connect the noise source 16 and the sensing circuit 24 to the filter 14 and output of the receiver 20 respectively. This control signal may also be operative to connect the sensing circuit 24, the memory circuit 42 and the motor control circuit 46 to a source of operating potential. The input to the sensing circuit is a terminal 48 of an input transformer 50. The other terminal of the input winding of the transformer 50 is grounded. In the event that the receiver 20 is an independent sideband receiver having upper and lower channels, as from the upper and lower sidebands, it is desirable to connect the channel outputs from each of the sidebands to opposite ends of the input winding of the transformer 50. In that event, a center tap on the input winding should be connected to ground. An R.M.S. level detector 52 converts the noise signals from the receiver output into D.C. control voltages which are amplified in an amplifier stage 54. The output of this amplifier stage is connected over two paths as determined by the position of a pair of contacts K 1–1 and K 1–2 of a relay K1. All relay contacts are shown in FIGS. 3, 4 and 5 in their unoperated (de-energized) position (viz. the position in which they would be without operating power connected to their operating windings). Relay K1 is connected in a protective circuit 56 which prevents the system from starting up tuning operations in the condition where the filter passband is initially coincidental with the receiver channel. The circuit 56 includes an emitter follower stage 58 which is connected to the output of the amplifier 54 through relay contact K 1–2 when relay K1 is de-energized. The output of the amplifier 58 is connected by way of a Zener diode 64 to a relay operating transistor 60. Thus, upon tuning command being given, the motor, in the same direction each start, begins scanning the filter through its tuning range. In the event that the filter passband initially overlaps, the channel noise is immediately detected and applied by way of the amplifier 58 to the relay driving transistor 60. The Zener diode 64 will remain high impedance so long as the transistor 58 is conducting. Thus, the relay K1 will remain de-energized. When the noise power is no longer detected or if the noise power was not initially detected, the transistor 58 will not conduct, thereby permitting a low impedance path to be established through the Zener diode 64. The transistor 60 is then forward biased and the relay K1 pulls in.

A locking contact to maintain transistor 58 cut off is established when the contact K 1–2 is connected to +B. Contact K 1–1 closes and the detected noise signal is applied to the other path in the sensing circuit by way of a resistor 68 and another Zener diode 70.

Before proceeding with the description of the sensing circuit, reference will be made to FIG. 4 which shows the motor control circuit. The motor 44 receives power from the alternating current line by way of a transformer 72. The secondary of the transformer is connected to a full wave bridge type rectifier 74 and thence to the contact K 7–1 of the relay K7. Current then flows through the contact K 5–1 of a relay K5; the operating winding of which is connected in the emitter circuit of a transistor 76. The transistor 76 is normally rendered non-conductive by virtue of the contacts K 4–1 of a relay K4 in the sensing circuit (FIG. 3) which is normally de-energized and pulls in only when the control signal corresponding to the passage of the filter 14 passband to the second point $T_2$ (FIG. 2) occurs. When the relay K6 pulls in, a resistor 78 is connected in series with the rectifier 74 to reduce the voltage across the motor, thereby causing it to quickly stop before reversing. Current flows to the motor through a pair of reversing switches provided by the contacts K 5–2 and K 5–3 of the relay K5 and also through contacts K 6–1 and K 6–2 of the relay K6. The operating winding of the relay K6 is connected through its holding contact K 6–3 from the operating voltage source +B to ground. An alternate shunt path to ground is provided through a limit switch $S_1$. Thus, the motor is reversed either upon the actuation of the relay K6 or upon the actuation of the relay K5.

If the selected receiver frequency is within the filter passband at the beginning of tuning operation or if the filter passband is beyond the receiver frequency in the direction of the limit $S_1$, tuning will continue until $S_1$ is actuated. Thereupon, relay K6 is operated and the motor 44 is reversed. The motor will then tune the filter in the opposite direction. The sensing system is, however bilateral. The first control point will be the point shown in FIG. 1 as $T_2$, while the second will be that shown in FIG. 2 as $T_1$. The sensing circuits, however, are independent of the direction of tuning through the receiver response. It is desirable to provide another limit switch (not shown) at the opposite end of the shaft 18 (FIG. 1) from the switch $S_1$. A circuit operated by this switch will be provided which will de-energize relay K7 causing it to drop out, thereby disconnecting the motor from the power line and causing the tuning to stop. An alarm operated by this other limit switch may be located at the control panel or on the receiver so as to indicate a malfunction. This may be the same alarm mentioned above which is an indication of a malfunction when the tuning system is used to check the performance of the receiver.

Returning now to FIG. 3, consider the case where the relay K1 is pulled in; no noise power being initially detected by the circuit 56. The noise signals then pass through the resistor 68 and the Zener diode 70. The Zener diode 70 acts as a threshold device with regard to signal levels. The signal levels are obtained from the collector of the amplifier transistor 54 and correspond to the noise power. When the Zener threshold is reached, a low impedance path applied to a transistor 90 base causes that transistor to conduct. This in turn causes the state of a bistable circuit made up of a pair of transistors 92 and 94 to change. The transistor 94 conducts providing a positive pulse at its emitter and across the resistor 96. This positive pulse is differentiated by a differentiating circuit made up of the capacitor 98 and a resistor 100. However, the positive-going spike is blocked by a diode 102. The positive pulse is, however, passed by a diode 104 to a bistable circuit consisting of the transistors 106 and 108. The pulse causes the transistor 106 to conduct, thereby energizing the operating winding 110 of the magnetic clutch 40, causing the clutch 40 to pull in. The clutch 40 is a two part clutch with the free wheeling part connected to a potentiometer slider 112 of the potentiometer 114 in the electrical memory circuit 42, shown in FIG. 5. A spring 116 which is connected to the shaft coupling the free wheeling part of the clutch to the potentiometer slider 112 indexes the slider to the minimum or zero resistance position of the potentiometer. This is at the upper end of the potentiometer resistor 114, as shown in FIG. 5.

Figure 2:
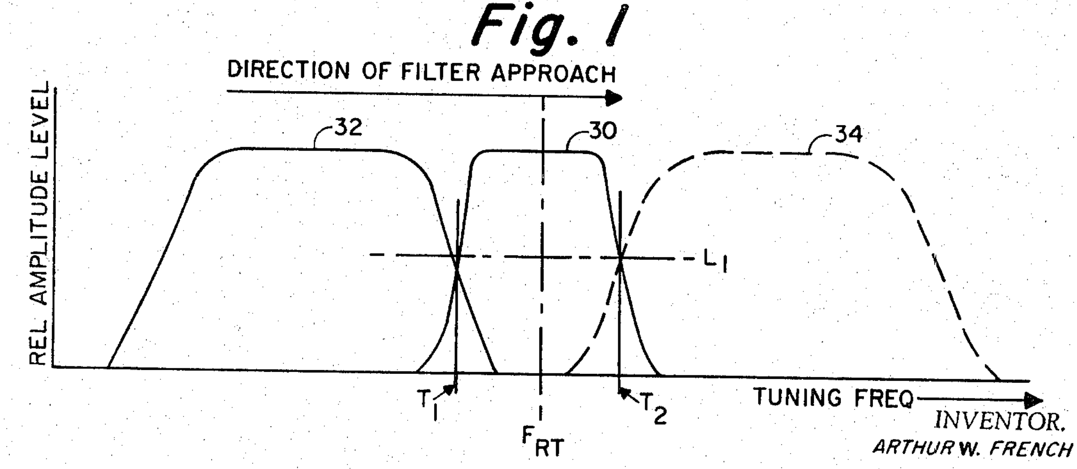
FIG. 2 is a graph representing the frequency characteristics of the filter and of a receiver to which the filter is connected.

The motor then continues to tune the filter 14, but also rotates the potentiometer. Referring to FIG. 2, it is noted that the point $T_1$ corresponds to the time when the clutch pulls in. This is the time when the threshold defined by the Zener diode 70 is exceeded. This threshold level is indicated as $L_1$ in FIG. 2. So long as the threshold is exceeded, the transistor 90 remains conductive. However, at the point $T_2$ the filter passband passes through the receiver response and the transistor 90 is rendered non-conductive. The bistable circuit consisting of the transistors 92 and 94 then resumes its initial state and a negative-going edge of a voltage level appears across the resistor 96. The edge is blocked by the diode 104 so that the clutch continues to remain pulled in. However, the differentiating circuit (capacitor 98 and a resistor 100) passes the negative-going pulse corresponding to the edge via the diode 102 to the base of a transistor 118 in a bistable pair consisting of the transistor 118 and another transistor 120. A Zener diode 122 is connected in the emitter collector path of the transistor 118 and stabilizes the current which is applied to the relay K4 which is also connected in the emitter collector path of the transistor 118. The relay K4 then pulls in.

Referring to FIG. 4, the contact K 4–1 of the relay K4 now reverses its position, as shown in the drawing, and causes the bias applied to the base of the transistor 76 via the resistor 124 to be removed. The base of the transistor 76 is now connected to ground via the collector resistor 126 thereof and another resistor 128. This causes the transistor 76 to become conductive, thereby operating the relay K5 and causing the motor 44 to reverse.

The memory circuit 42 (FIG. 5) is actuated at the time the clutch 40 is pulled in. In addition to the potentiometer 114, the memory circuit includes a storage capacitor 130 and a charging circuit for that storage capacitor, including the collector to emitter path of a transistor 132 and the contact K 4–2 of the relay K4. The transistor 132 is base connected to the collector of a transistor 134. The potentiometer 114 and another resistor 136 are connected in the collector-emitter path of the transistor 134. The resistor 136 is shunted by a pair of resistors 138 and 140 which are connected across the resistor 136 by the contact K 5–4 of the relay K5. The resistance provided by the resistor 138 and a resistor 140, which is in the form of a trimming potentiometer, is equal to the resistance of the resistor 136. A Zener diode 142 is connected across the source of operating voltage +B by way of resistor 144. This fixes the bias on the base of the transistor 134 so that this transistor is normally saturated.

A switching transistor 146 is emitter connected to the capacitor 130 and base connected to the emitter of the transistor 132 (viz. across its emitter resistor 148). With the relay contact K 4–2 closed (the relay K4 de-energized), the base of the transistor 146 is shorted to its emitter. The transistor is then normally non-conductive. The collector of the transistor 146 is connected to a bistable circuit including a pair of transistors 150 and 152. This circuit is normally non-conductive, by virtue of the biasing thereof. The operating winding of the relay K7 is connected between the emitter of the transistor 152 and ground. Accordingly, when +B is applied to the memory circuit, the relay K7 is pulled in. It will be recalled that the relay K7's contacts are in the current path to the motor 44 (FIG. 4).

In operation, when the clutch 40 pulls in, the resistance of potentiometer 114 increases, thereby providing a linear decrease in the voltage across the resistor 136. Since this voltage controls the effective resistance in the collector to emitter path of the transistor 132, the capacitor 130 will charge linearly. The voltage across the capacitor 130 is therefore directly related to the position of the filter 14 bandpass. When the negative step or control signal occurs at point $T_2$, both the contact K 4–2 opens and the contact K 5–4 closes. The motor, of course, is reversed and begins to reduce the value of resistance presented across the potentiometer. However, the resistance in the collector circuit of the transistor 134 is halved by the closure of K 5–4. The transistor 146 will conduct when its emitter voltage exceeds the base voltage. When the motor is initially reversed, the voltage across the resistor 136, 138 and 140 combination is approximately half what it was during the preceding instant. Thus, the transistor 146 remains reverse biased and cut off by virtue of a like voltage appearing across the resistor 148. However, since the resistance is half of what it was prior to closure of contact K 5–4, a reduction of the potentiometer resistance by approximately one-half of what would otherwise be necessary if only the resistor 136 were in the circuit is required to produce a voltage across a combination of resistors 136, 138 and 140 which would be equal to the voltage stored in the capacitor 130 at the instant K 4–2 opened. Consequently, the slider 112 of the potentiometer need only move half the distance that it initially moved in charging the capacitor 130 to cause the transistor 146 to become conductive. This position corresponds to the tuning of the filter, such that its bandpass is symmetrically astride the receiver response, thereby tuning the filter 114 exactly to its desired frequency without hunting and more rapidly than could otherwise be accomplished. The forward biasing of the transistor 146 causes a positive voltage to be applied to the base of the transistor 150 which reverses the state of the bi-stable circuit, thereby de-energizing the relay K7 and causing its contacts to drop out. The power is then disconnected from the motor and the tuning process is completed. By operating the power switch (disconnecting and then re-connecting +B to the memory circuit 42), the relay K7 can be reset and another tuning operation initiated.

From the foregoing description it will be apparent that there has been provided an improved system for automatically tuning electronic circuits. While the system has been described in connection with the tuning of a variable bandpass filter utilized as a preselector for a receiver, it will be appreciated that the tuning system may be used to tune any tuned circuit so that it lies centered with respect to the bandpass of a demodulating device. Thus, if the circuit to be tuned were an antenna coupler for a transmitting antenna, the noise source and a demodulating device tuned to the desired frequency of transmission could be substituted for the receiver and the coupling circuit tuned so that the bandpass is coincident with the frequency to which the demodulating circuit is receptive. Pilot tones are therefore not required.

Other variations and modifications in the herein described system will, of course, become apparent to those skilled in the art. Accordingly, the foregoing description should be taken merely as illustrative and not in any limiting sense.

What is claimed is:

1. A system for tuning a tunable electronic circuit comprising (a) demodulating means having a frequency response channel with a certain passband coupled to the output of said circuit, said circuit also having a certain bandwidth, (b) means for applying a signal having components which extend across the tuning range of said circuit to the input of said circuit, and (c) means operated by the output of said demodulating means for tuning said circuit in one sense so that the passband of said circuit traverses the channel of said demodulating means; the skirts of said passband of said circuit both traveling across both skirts of the passband of said channel; and then in an opposite sense until the passband of said circuit is centered with respect to said channel; said last-named means including tuning control means for said circuit responsive to the passage of said circuit bandpass skirts over said channel bandpass skirts.

2. The invention as set forth in claim 1 wherein said demodulating means is a receiver which is tunable to select said frequency response channel.

3. The invention as set forth in claim 1 wherein said signal applying means include a source of white noise.

4. The invention as set forth in claim 2 wherein said circuit is a variable bandpass preselector filter for said receiver.

5. The invention as set forth in claim 1 wherein said tuning means comprises (a) electromechanical means for varying the tuning of said circuit, (b) sensing means coupled to the output of said demodulating means for producing first and second control signals when said demodulating means output respectively increases above and decreases below a predeterminal level, (c) memory means responsive to said first and second control signals for storing information corresponding to the motion of said electromechanical means between the instants that said first and second signals occur, and (d) control means operated in response to said second signal and said information for operating said electromechanical means to respectively reverse the sense of said tuning and stop said tuning when the passband of said circuit is centered with respect to said channel.

6. The invention as set forth in claim 5 wherein said memory means comprises (a) an electromagnetic clutch mechanically coupled to said electromechanical means, electrically coupled to sensing means so as to be energized in response to said first signal, (b) means mechanically coupled to said clutch when energized for translating the motion of said electromechanical means into a further signal, (c) means for storing said further signal, (d) means included in said translating means and operated by said second signal for halving the ratios by which said motion of said mechanical means is translated in said further signal so that half as much motion produces a like further sginal, and (e) means operated in response to said second signal for comparing said further signal and storing means stored in said storing means with said further signal for stopping said electromechanical means when said two last named signals are equal to each other.

7. The invention as set forth in claim 5 including (a) means included in said sensing means for initially inhibiting the generation of said first and second signals when the output of said demodulating means initially exceeds said predetermined level until said output drops below said predetermined level, and (b) means for reversing the sense of motion of said electromechanical means when it reaches at least one end of its travel.

8. The invention as set forth in claim 7 wherein (a) said storing means is a capacitor, (b) said translating means includes a potentiometer coupled to said clutch when said clutch is energized, and a charging circuit for said capacitor including said potentiometer and a first resistor, and (c) wherein said means included in said translating means is operated by said second signal including a second resistance having a value of resistance equal to the value of said first resistor.

9. The invention as set forth in claim 8 wherein said comparing means includes a switching transistor, means for applying a voltage corresponding to the voltage across said potentiometer to one control electrode of said switching transistor and the voltage across said capacitor across the other control electrode thereof.

10. The invention as set forth in claim 8 wherein said means operated by said first and second signals include a plurality of relays.

11. A system for tuning a tuned circuit so that its passband is precisely located with respect to a selected frequency comprising (a) a noise source, (b) means for connecting said source to the input of said tuned circuit, (c) demodulating means for producing an output signal over a selected frequency channel centered at said selected frequency, (d) means for coupling the output of said tuned circuit to an input of said demodulating means, (e) means coupled to said tuned circuit for varying the tuning thereof, (f) a sensing circuit responsive to said output signal for producing first and second signals while said tuning of said circuit is varied respectively at the instants when said output signal exceeds and drops below a certain level, (g) a memory for storing information corresponding to the tuning range of said circuit scanned between the occurrence of said first and second signals, (h) means responsive to said second signal for reversing the sense of said tuning in a sense opposite from that which existed while said information was being stored, (i) means for generating information corresponding to the tuning range scanned after said reversal of tuning sense, and (j) means operated by said last two named means for stopping said tuning when said reverse sense of tuning covers one-half the tuning range represented by said stored information, whereby to locate the center of said passband at said selected frequency.

References Cited

UNITED STATES PATENTS

| | | | |
|---|---|---|---|
| 2,584,004 | 1/1952 | Enslein | 325—363X |
| 2,719,923 | 10/1955 | McNaney | 334—26X |
| 2,727,994 | 12/1955 | Enslein | 334—27 |
| 2,843,747 | 7/1958 | Ashley | 334—27 |

OTHER REFERENCES

Radio Amateurs Handbook: 40th edition, 1963, pp. 529–530, "Noise Generators."

ROBERT L. GRIFFIN, Primary Examiner

B. V. SAFOUREK, Assistant Examiner

U.S. Cl. X.R.

325—469; 334—26